(12) United States Patent
Morozumi et al.

(10) Patent No.: US 7,041,546 B2
(45) Date of Patent: May 9, 2006

(54) FILM FORMING METHOD FOR DEPOSITING A PLURALITY OF HIGH-K DIELECTRIC FILMS

(75) Inventors: Yuichiro Morozumi, Tokyo-To (JP); Kazuhide Hasebe, Tokyo-To (JP); Shigeru Nakajima, Tokyo-To (JP); Haruhiko Furuya, Tokyo-To (JP); Dong-Kyun Choi, Tokyo-To (JP); Takahito Umehara, Tokyo-To (JP); Katsushige Harada, Tokyo-To (JP); Tomonori Fujiwara, Tokyo-To (JP); Hirotake Fujita, Tokyo-To (JP)

(73) Assignee: Tokyo Electron Limited, Tokyo-To (JP)

( * ) Notice: Subject to any disclaimer, the term of this patent is extended or adjusted under 35 U.S.C. 154(b) by 135 days.

(21) Appl. No.: 10/639,773

(22) Filed: Aug. 13, 2003

(65) Prior Publication Data
US 2004/0195653 A1   Oct. 7, 2004

(30) Foreign Application Priority Data
Aug. 13, 2002   (JP) .............................. 2002-236098

(51) Int. Cl.
*H01L 21/8238* (2006.01)
(52) U.S. Cl. ....................... 438/216; 438/287; 438/785

(58) Field of Classification Search ................ 438/216, 438/287, 763, 785, 786
See application file for complete search history.

(56) References Cited

U.S. PATENT DOCUMENTS

| | | | | |
|---|---|---|---|---|
| 6,586,349 B1* | 7/2003 | Jeon et al. | ................... | 438/785 |
| 6,713,846 B1* | 3/2004 | Senzaki | ....................... | 257/635 |
| 6,790,755 B1* | 9/2004 | Jeon | ........................... | 438/591 |
| 6,867,101 B1* | 3/2005 | Yu | .............................. | 438/287 |
| 2002/0106536 A1 | 8/2002 | Lee et al. | ................... | 428/702 |
| 2003/0194853 A1* | 10/2003 | Jeon | ........................... | 438/591 |

\* cited by examiner

*Primary Examiner*—George Fourson
*Assistant Examiner*—Fernando L. Toledo
(74) *Attorney, Agent, or Firm*—Smith, Gambrell & Russell, LLP

(57) ABSTRACT

In a capacitor of an MIM (Metal-Insulator-Metal) structure, a silicon-containing high dielectric film (e.g., a hafnium silicate film) containing a silicon atom, as well as a silicon-free high dielectric film (e.g., a tantalum oxide film) containing no silicon atom is interposed between a lower electrode film and an upper electrode film which are made of metal or metal compound. By adding the silicon-containing high dielectric film, a leak current can be suppressed and the change in capacitor capacity accompanied with the change in applied voltage can be reduced.

4 Claims, 6 Drawing Sheets

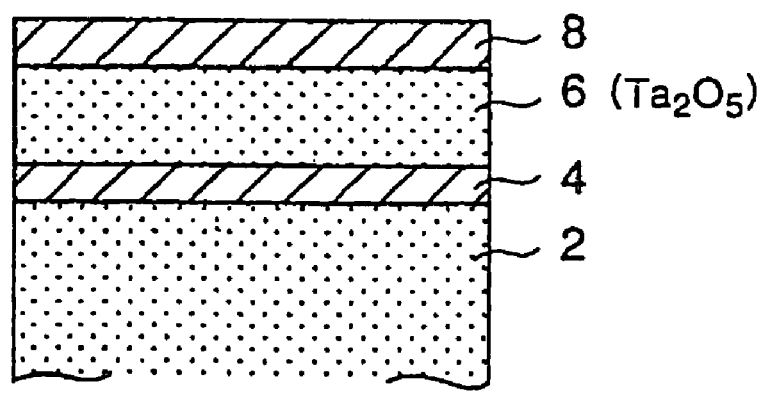
F I G. 6

US 7,041,546 B2

FILM FORMING METHOD FOR DEPOSITING A PLURALITY OF HIGH-K DIELECTRIC FILMS

TECHNICAL FIELD

The present invention relates to a capacitor structure, a film forming method, and a film forming apparatus.

BACKGROUND ART

In manufacturing a semiconductor device, a semiconductor wafer is repeatedly subjected to a film forming process and a pattern etching process, in general. Design rules are becoming stricter every year in accordance with a recent increase in density and integration of semiconductor devices. For example, a very thin oxide film such as an insulator film of a capacitor structure is required to be much thinner, and have a higher insulation performance as well.

Although silicon oxide film and a silicon nitride film may be used as such insulation film, the recent trend is to use a metal oxide film having a higher insulation performance, such as tantalum oxide film ($Ta_2O_5$). The metal oxide film has a reliable insulation performance even if the film thickness is small.

When forming a tantalum oxide film, pentaethoxytantalum ($Ta(OC_2H_5)_5$) (hereinafter referred to as "PET"), which is a metal alkoxide of tantalum, is used as a material for forming the film. PET is bubbled with helium gas or the like to be supplied into a process chamber of a vacuum atmosphere. Then, a tantalum oxide film is formed, by a CVD (Chemical Vapor Deposition), on a semiconductor wafer maintained at a relatively low process temperature, such as about 410° C., in the processing chamber.

FIG. 6 shows a capacitor structure of an MIM (Metal-Insulator-Metal) structure employing a tantalum oxide film. The capacitor structure is composed of films formed on a semiconductor wafer 2 of silicon substrate, which includes lower electrode film 4, an upper electrode film 8, both of which are made of metal such as Ru (ruthenium) or metal compound such as TiN (titanium nitride), and a high dielectric film 6 made of a high dielectric substance such as $Ta_2O_5$ (tantalum oxide) interposed between the lower and upper electrode films 4 and 8.

A film thickness of the high dielectric film 6 is about 8 to 12 nm when the film is used for a front end of an integrated circuit, and about 20 to 60 nm when used for a back end. The term "front end" refers to lower to middle layers of a multilayered integrated circuit, and the term "back end" refers to middle to upper layers of the same.

Recently, the use of the above MIM structure for a capacitor structure of the back end has been considered. However, in the aforementioned conventional MIM structure, although leakage current is sufficiently low if low operation voltage such as about ±1V is applied thereto, leakage current is considerably high if high operation voltage such as about ±5V is applied thereto.

In addition, a slight change in a capacity of the capacitor structure accompanied with a change of an applied voltage is inherently inevitable, but with aforesaid conventional MIM structure, change in the capacity of the capacitor structure accompanied with change in applied voltage is considerably large.

SUMMARY OF THE INVENTION

The present invention is made in order to solve the above disadvantages.

The object of the present invention is to provide a capacitor structure that achieves suppression of increase in the leakage current accompanied with increase in applied operation voltage and suppression of change in capacity due to the change in applied voltage, without excessive increase in the thickness of the dielectric layer.

Another object of the present invention is to provide a film forming method and a film forming apparatus for obtaining the above capacitor structure.

In order to achieve the objectives, according to the first aspect of the present invention, there is provided a capacitor structure including: a lower electrode film made of metal or metal compound; an upper electrode film made of metal or metal compound; a silicon-free high dielectric film, containing no silicon atom, interposed between the lower and the upper electrode films; and at least one silicon-containing high dielectric electrode film, containing silicon atom, interposed between the lower and the upper electrode films.

According to the present invention, as the silicon-free high dielectric film and said at least one layer of silicon-containing high dielectric film are interposed between a lower electrode film and an upper electrode film, low leak current is achieved even when the applied voltage in operation is high, and suppression of change in the capacity accompanied with change in the applied voltage is achieved, without excessive increase in the thickness of dielectric layers.

The silicon-containing high dielectric film may be arranged between the lower electrode film and the silicon-free high dielectric film.

Alternatively, the silicon-containing high dielectric film may be arranged between the upper electrode film and the silicon-free high dielectric film.

The capacitor structure may include two silicon-containing high dielectric films. In this case, a first silicon-containing high dielectric film may be arranged between the lower electrode film and the silicon-free high dielectric film, while a second silicon-containing high dielectric film may be arranged between the upper electrode film and the silicon-free high dielectric film.

The silicon-containing high dielectric film may be made of a material selected from the group consisting of HfSiOx, ZrSiOx, or TaSiOx (x is a positive number).

The silicon-free high dielectric film may be made of a material selected from the group consisting of TaOx, HfOx, ZrOx (x is a positive number), SBT (oxide of Sr, Bi and Ta), BSTO (oxide of Ba, St and Ti), or PZT (oxide of Pb, Zr and Ti).

According to the second aspect of the present invention, there is provided a film forming method for depositing a plurality of high dielectric films of metal oxide films on a surface of an object, to be processed, held in a processing space within a processing vessel by using a metal contained gas as a source gas, the method including the steps of: forming a silicon-containing high dielectric film which contains silicon atom; and forming a silicon-free high dielectric film which contains no silicon atom.

The step of forming a silicon-containing high dielectric film may be carried out twice. In this case, each of the steps may be carried out before and after the step of forming the silicon-free high dielectric film.

The silicon-containing high dielectric film may be made of a material selected from the group consisting of HfSiOx, ZrSiOx, or TaSiOx (x is a positive number).

The silicon-free high dielectric film may be made of a material selected from the group consisting of TaOx, HfOx, ZrOx (x is a positive number), SBT (oxide of Sr, Bi and Ta), BSTO (oxide of Ba, St and Ti), or PZT (oxide of Pb, Zr and Ti).

The silicon-containing high dielectric film may be deposited by supplying a metal-contained gas and a silane series gas into the processing vessel.

Preferably, a supply of the silane series gas into the processing vessel is started preceding the start of the supply of the metal-containing gas by a predetermined time period. Thereby, decomposition of the silane series gas, which is relatively difficult at a low temperature, is promoted.

According to the third embodiment of the present invention, there is provided a film forming apparatus for performing a predetermined film forming process to an object to be processed, including: a processing vessel adapted to be evacuated; an object supporting means for supporting the object in the processing vessel; a heating means for heating the object; a first source gas supplying means for supplying a source gas into the processing vessel when forming a silicon-containing high dielectric film; a second source gas supplying means for supplying a source gas into the processing vessel when forming a silicon-free high dielectric film; and a preheating means for preheating the source gases.

BRIEF DESCRIPTION OF THE DRAWINGS

FIG. 6 schematically shows a capacitor structure of an MIM structure.

DETAILED DESCRIPTION OF THE PREFERRED EMBODIMENTS

Preferred embodiments of the present invention will be described with reference to the attached drawings. The following description is made for an illustrative case in which a tantalum oxide film ($Ta_2O_5$) as a silicon-free high dielectric film is formed by a thermal CVD, and a hafnium silicate (HfSiOx) film as a silicon-containing high dielectric film is formed by a thermal CVD.

Figure 1:
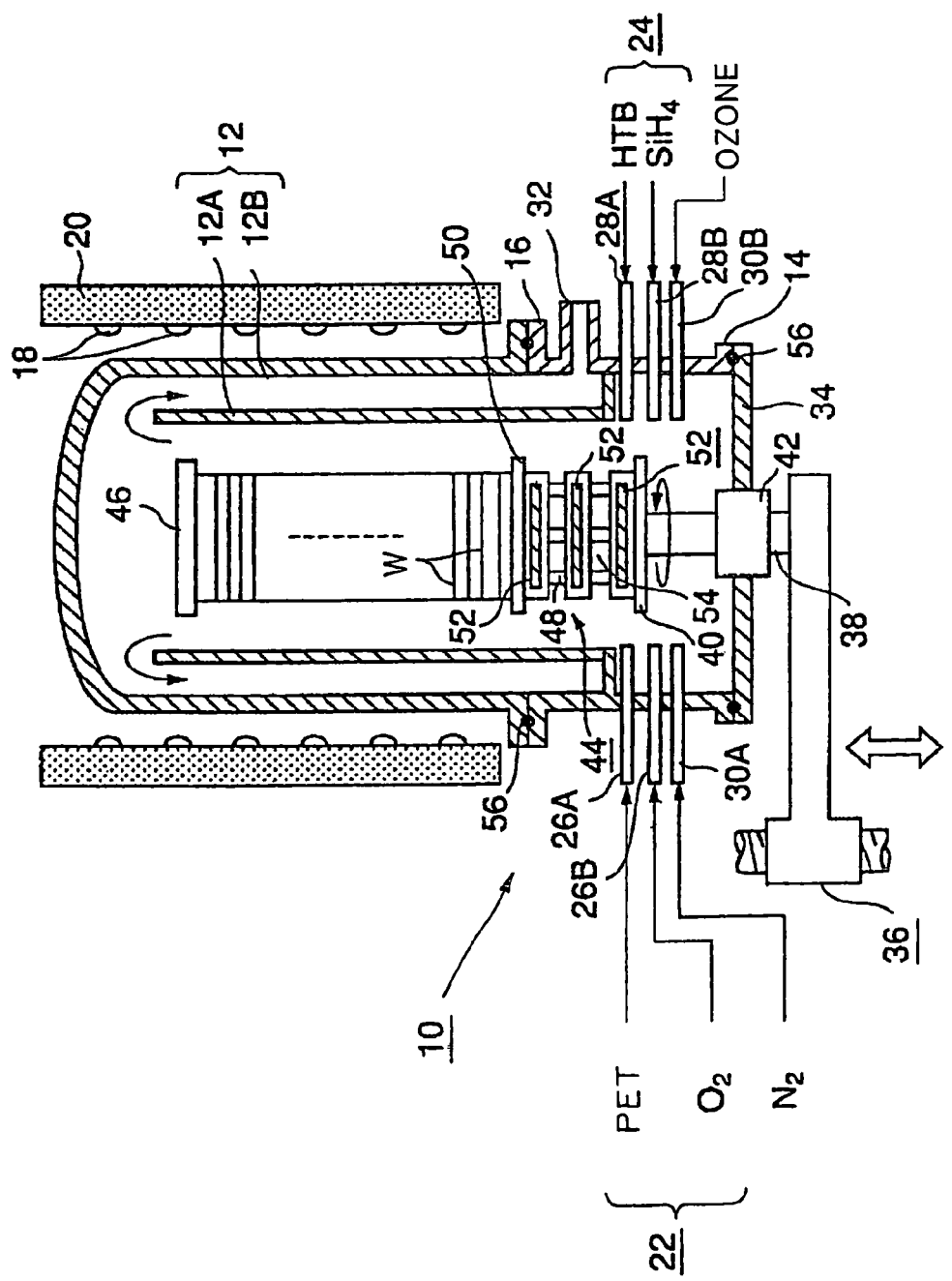
FIG. 1 shows a structure of a film forming apparatus in one embodiment of the present invention.

A film forming apparatus will be described with reference to FIG. 1. The film forming apparatus 10 includes a cylindrical processing vessel 12 made of quartz. The upper end of the processing vessel 12 is closed. A lower end of the processing vessel 12 is opened. The processing vessel 12 is of a dual tube structure having an inner tube 12A and an outer tube 12B concentrically arranged around the inner tube 12A. The processing vessel 12 is supported by a manifold 14 made of stainless steel which is connected to the lower end of the processing vessel 12. A flange 16 for connection is provided at an outer periphery of the manifold 14. The processing vessel 12 is covered with a cylindrical heat insulative material 20 provided with heaters 18 on an inner surface thereof.

A source gas supply means for introducing a source gas is provided at a lower part of the sidewall of the manifold 14. The source gas supply means includes a first source gas supply means 22 for supplying a source gas when forming a silicon-free high dielectric film, and a second source gas supply means 24 for supplying a source gas when forming a silicon-containing high dielectric film.

The first source gas supply means 22 has two nozzles 26A and 26B passing through the sidewall of the manifold 14 for supplying two kinds of source gases. PET (pentaethoxytantalum) vapor and $O_2$ gas are used as the two kinds of gases. PET is a liquid material, and is vaporized by a vaporizer (not shown) to be supplied into the processing vessel with its flow rate being controlled. A tape heater (not shown) for preventing condensation of PET is wound around a supply pipeline (not shown) for supplying PET, so that PET is flown through the supply pipeline with its temperature being maintained at about 150 to 180° C.

The second source gas supply means 24 has, in the illustrated embodiment, two nozzles 28A and 28B passing through the sidewall of the manifold 14 for supplying two kinds of source gases. HTB ($Hf(OC_4H_9)_4$: tetra.t-butoxyhafnium) vapor and a silane series gas such as $SiH_4$ (monosilane) gas are used as the two kinds of source gases. HTB is a liquid material, and is vaporized by a vaporizer (not shown) to be supplied into the processing vessel with its flow rate being controlled. A tape heater (not shown) for preventing condensation of HTB is wound around a pipeline (not shown) for supplying HTB, so that HTB is flown through the supply pipeline with its temperature being maintained at about 50 to 150° C.

A nozzle 30A for supplying an inert gas such as $N_2$ gas, and a nozzle 30B for supplying ozone ($O_3$) gas used for modifying a deposited film pass through the sidewall of the manifold 14. These gases are supplied to the processing vessel with their flow rates being controlled by a flow rate controller, such as a mass flow controller, so as to comply with the demand.

The manifold 14 has an exhaust port 32 having a relatively large diameter, which is communicated with a gap between the inner tube 12A and the outer tube 12B. A not-shown exhaust system provided with an air displacement pump is connected to the exhaust port 32. A cap 34 is provided for sealingly closing the lower opening of the manifold 14. The cap 34 is vertically moved by an elevating mechanism, such as a boat elevator.

A rotary shaft 38 passes through the cap 34, and a table 40 is provided on an upper end of the rotary shaft 38. A magnetic fluid seal 42 is arranged at a portion, where the rotary shaft 38 penetrates, of the cap 34, for air-tightly sealing the cap 34 and the rotary shaft 38, while allowing rotation of the rotary shaft 38. A heat insulating tube 44 is arranged on the table 40, and a wafer boat 46 made of quartz, i.e., means for holding objects to be processed, is arranged on the heat insulating tube 44. Semiconductor wafers W, which are objects to be processed, are carried by the wafer boat at predetermined intervals in multistage. The heat insulating tube 44 is entirely made of quartz glass, and has three heater plates 50 of quartz connected with one another at predetermined intervals via a plurality of pillars 48 made of quartz. A resistance heater 52, i.e., preheating means, is embedded in each of the quartz heater plates 50. The heat insulating tube 44 is entirely heated up to a predetermined temperature by the resistance heaters 52, so that a preheating space 54 for preheating a process gas passing therethough is formed around the heat insulating tube 44. Reference numeral 56 in FIG. 1 indicates a sealing member, such as an O-ring.

Next, a method for manufacturing a capacitor structure performed by using the above film forming apparatus and the capacitor structure obtained by the same will be described.

The capacitor structure according to the present invention is characterized by interposing at least one layer of a silicon-containing high dielectric film containing silicon atom, such as hafnium silicate (HfSiOx), in addition to a silicon-free high dielectric film containing no silicon atom such as tantalum oxide film, is interposed between a lower electrode film and an upper electrode film.

Figure 2:
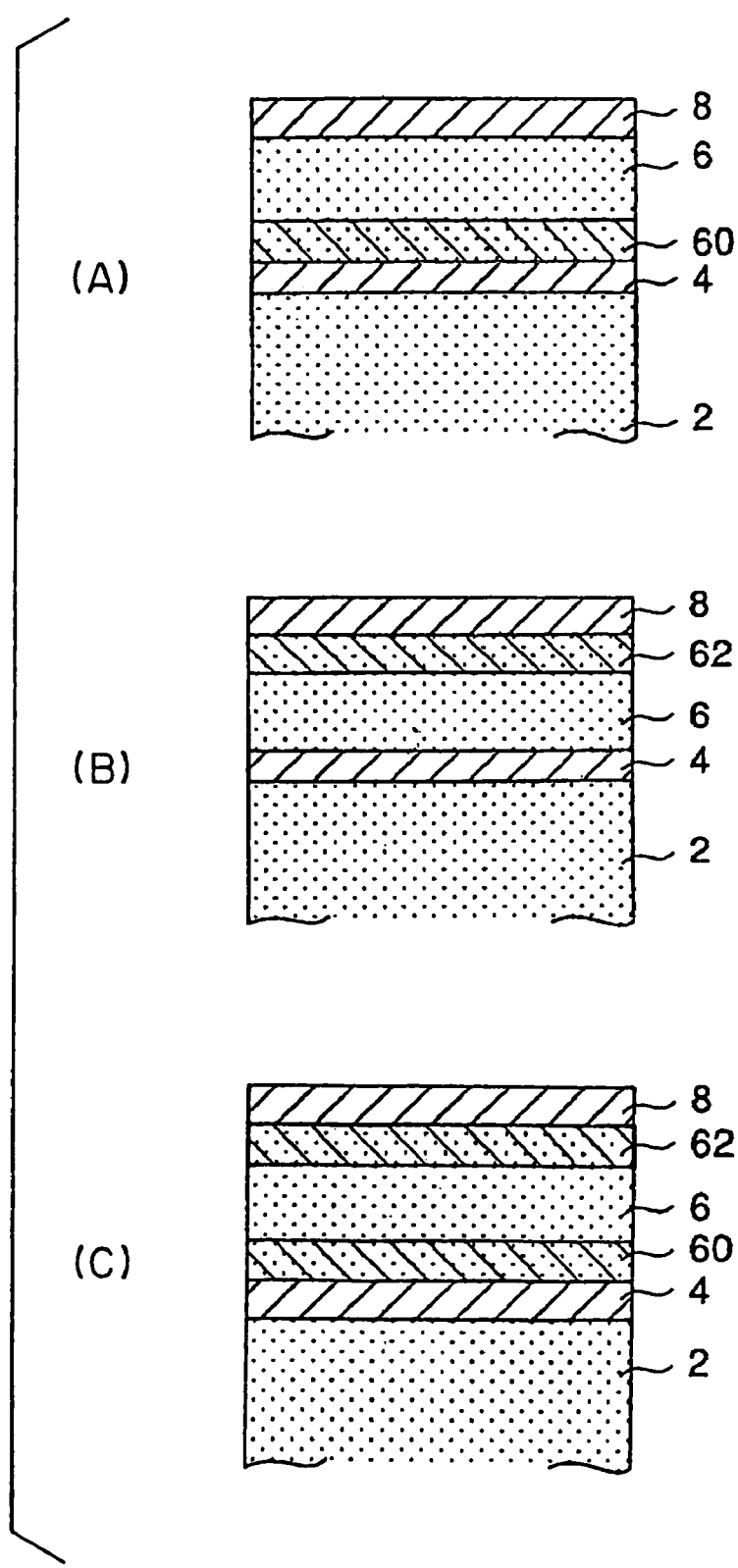
FIG. 2 show schematic sectional views of embodiments of capacitor structure according to the present invention.

FIG. 2 shows embodiments of the capacitor structure according to the present invention. In FIG. 2, the same elements as shown in FIG. 6 are designated by the same reference numerals. In the first embodiment shown in FIG. 2(A), a lower electrode 4, a silicon-containing high dielectric film 60 of hafnium silicate, a silicon-free high dielectric film (tantalum oxide film) 6 of tantalum oxide, and an upper electrode 8 are stacked in that order on a surface of a semiconductor wafer 2 formed of a silicon substrate. The lower electrode 4 and the upper electrode 8 are formed by means of a sputtering apparatus which is separated from the film forming apparatus.

In the second embodiment shown in FIG. 2(B), a lower electrode 4, a silicon-free high dielectric film (tantalum oxide film) 6 of tantalum oxide, a silicon-containing high dielectric film 62 of hafnium silicate, and an upper electrode 8 are stacked in that order on a surface of a semiconductor wafer 2.

In the third embodiment shown in FIG. 2(C), a lower electrode 4, a first silicon-containing high dielectric film 60 of hafnium silicate, a silicon-free high dielectric film (tantalum oxide film) 6 of tantalum oxide, a second silicon-containing high dielectric film 62 of hafnium silicate, and an upper electrode 8 are stacked in that order on a surface of a semiconductor wafer 2.

A method of forming the high dielectric film will be described below.

In an unloading condition where the cap 34 is lowered, a plurality of unprocessed semiconductor wafers W are placed on the wafer boat 46 at predetermined intervals in multi-stage. The wafer boat 46 holds, for example, about 50 to 100 pieces of 8-inch wafers arranged thereon. The lower electrode 4 shown in FIG. 2 has been already deposited on each semiconductor wafer W by sputtering process performed under a process temperature of room temperature to about 200° C. by means of a sputtering apparatus. The lower electrode 4 has been subjected to a patterning process to be in a predetermined geometry. The lower electrode 4 is made of such material as titan nitride (TiN) or Ru (ruthenium).

When the elevating mechanism 36 is driven to elevate the cap 34, the wafer boat 46 holding the wafers W thereon is loaded into the processing vessel 12 from the lower opening thereof, and the opening is closed by the cap 34 so that a sealed space is defined in the processing vessel 12.

The interior of the processing vessel 12 is evacuated, and the semiconductor wafers W are heated up to and maintained at a predetermined processing temperature by means of the heater 18. Then, process gases are supplied to the processing vessel 12, and the interior of the processing vessel 12 is maintained at a predetermined process pressure.

The process gases supplied from the respective nozzles rise in the inner tube 12A while in contact with the wafers W, turn downward at the upper part of the processing vessel 12 to flow down through the gap between the inner tube 12A and the outer tube 12B, and are discharged through the exhaust port 32.

Processes for forming a silicon-containing high dielectric film and for forming a silicon-free high dielectric film are sequentially carried out by supplying predetermined process gases to the processing vessel 12 as mentioned above.

Figure 3:
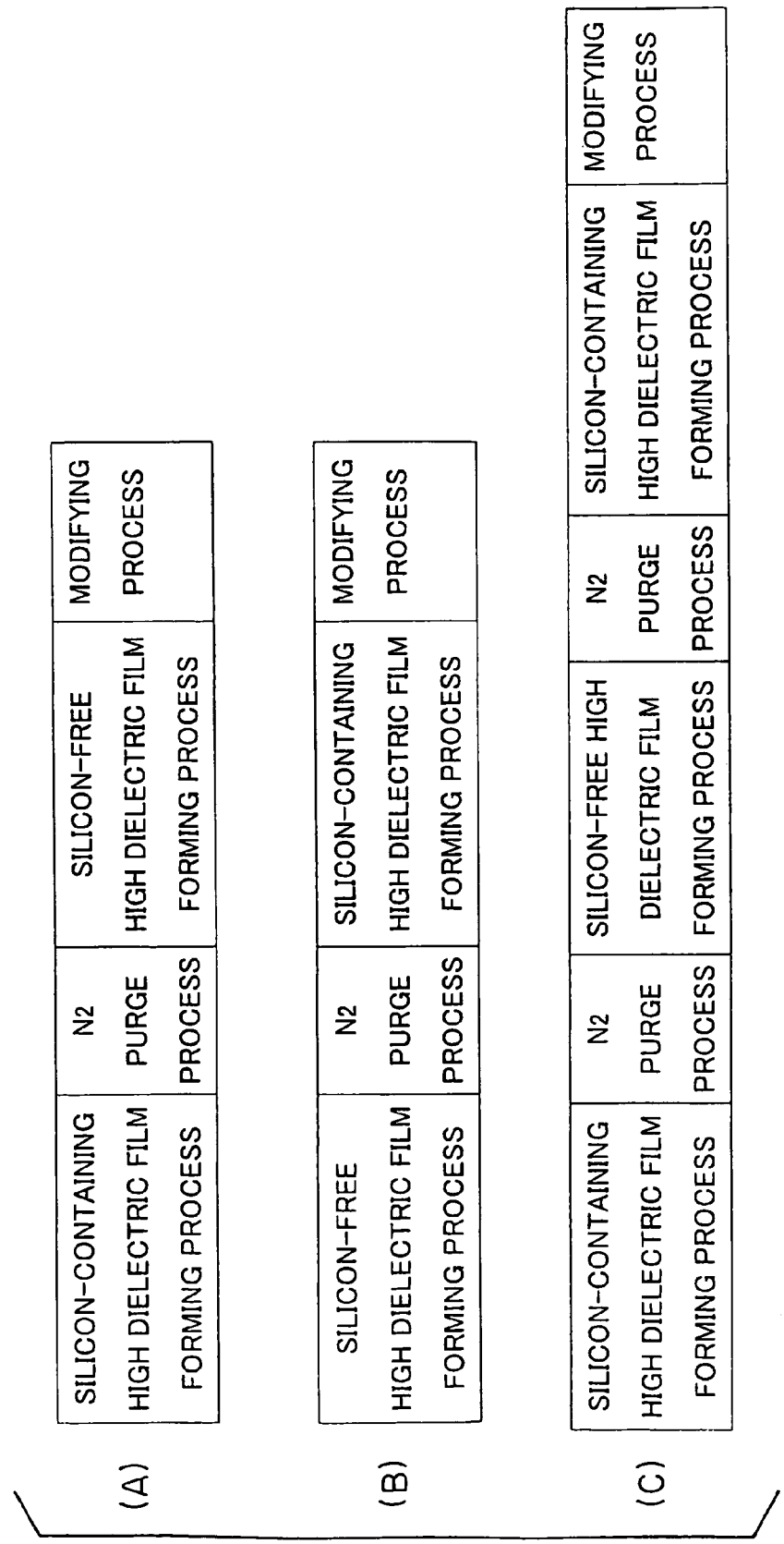
FIG. 3 is a chart showing examples of the procedure for a film forming method according to the present invention.

FIGS. 3(A), 3(B), and 3(C) are charts showing a series of processes carried out for manufacturing the capacitor structures shown in FIGS. 2(A), 2(B), and 2(C) respectively.

As shown in FIG. 3(A), when manufacturing the capacitor structure of the first embodiment shown in FIG. 2(A): a process of forming a silicon-containing high dielectric film is performed; then, an $N_2$ purge process in which a large amount of $N_2$ gas is supplied into the processing vessel is performed to purge the process gas remaining in the processing vessel 12; then, a process of forming a silicon-free high dielectric film is performed; and then, a modifying process is performed by supplying ozone gas to modify the nature of the previously deposited films.

As shown in FIG. 3(B), when manufacturing the capacitor structure of the second embodiment shown in FIG. 2(B): a process of forming a silicon-free high dielectric film is performed; then, an $N_2$ purge process is performed; then, a process of forming a silicon-containing high dielectric film is performed; and then, a modifying process is performed by supplying ozone gas to modify the nature of the previously deposited films.

As shown in FIG. 3(C), when manufacturing the capacitor structure of the third embodiment shown in FIG. 2(C): a process of forming a silicon-containing high dielectric film is performed; then, an $N_2$ purge process is performed; then, a process of forming a silicon-free high dielectric film is performed; then, an $N_2$ purge process is performed; and then a modifying process is performed to modify the nature of the previously deposited films.

Next, the above processes will be described in detail.

In the process of forming the silicon-containing high dielectric film, an organic material HTB as a metal-containing gas and a monosilane ($SiH_4$) as a silane series gas are used as source gases. Since HTB is in a liquid state at a room temperature, HTB is vaporized by means of a vaporizer, or by bubbling heated HTB with an inert gas or the like, for use. Monosilane gas and HTB vapor are supplied into the processing vessel 12 at flow rates of about 300 sccm and about 0.1 cc/min (in liquid volume), respectively. The process temperature is about 260° C., and the process pressure is about 40 Pa.

HTB vapor and monosilane gas supplied into the processing vessel 12 exhibit a decomposition reaction, so that a hafnium silicate (HfSiOx) film as a silicon-containing high dielectric film 60 or 62 is deposited on a surface of each wafer W. A thickness of the hafnium silicate film is determined depending on required characteristics of the capacitor structure, and is 8 nm, for example.

When supplying process gases to the processing vessel 12, the resistance heaters 52 for pre-heating of the heat insulating tube 44 have previously been heated to a predetermined temperature of about 50 to 150° C., at which temperature HTB vapor (source gas) is partially decomposed. HTB vapor flown into the preheating space 54 heated by the resistance heaters 52 is heated to be partially decomposed. The partially decomposed HTB vapor rises in the processing vessel 12 while being mixed with monosilane gas, and contacts with a surface of each wafer W so that a hafnium silicate film is formed thereon.

Figure 4:
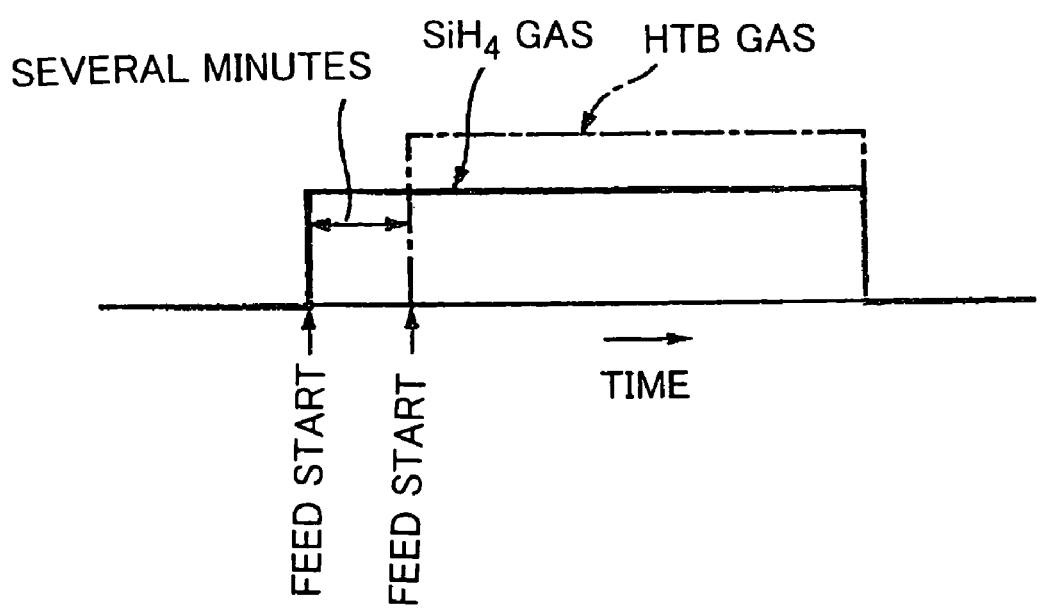
FIG. 4 is a chart showing the timing of the feed of HTB (tetra.t-butoxyhafnium) gas and monosilane gas.

When HTB vapor and monosilane gas are supplied to the processing vessel 12 as mentioned above, it is preferable, as shown in FIG. 4, that the starting of the feed of monosilane gas precedes the starting of HTB vapor by a predetermined time period, such as about 2 to 3 minutes. In this manner, HTB vapor, which is relatively easily decomposed, is mixed into an atmosphere of a monosilane gas, which is relatively difficult to decompose. Thus, due to the synergetic effect of these gases, decomposition of monosilane gas is promoted, resulting in improved film-forming efficiency.

In the process of forming the silicon-free dielectric film, an organic material PET as a metal-containing gas and an $O_2$ gas as an oxidation gas are used as source gases. Since PET is in a liquid state at a room temperature, PET is vaporized by means of a vaporizer, or by bubbling heated PET with an inert gas or the like, for use. $O_2$ gas and PET vapor are supplied into the processing vessel 12 at flow rates of about 1000 sccm and about 0.4 cc/min (in liquid volume), respectively. The process temperature is about 400° C., and the process pressure is about 40 Pa.

PET vapor and $O_2$ gas supplied into the processing vessel 12 exhibit a decomposition reaction, so that a tantalum oxide ($Ta_2O_5$) film as a silicon-free high dielectric film 6 is deposited on a surface of each wafer W. Thickness of the tantalum oxide ($Ta_2O_5$) film is determined depending on required characteristics of the capacitor structure, and is 60 nm, for example.

When supplying process gases to the processing vessel 12, the resistance heaters 52 for pre-heating of the heat insulating tube 44 have previously been heated to a predetermined temperature of about 200 to 600° C., at which temperature PET vapor (source gas) is partially decomposed. PET vapor flown into the preheating space 54 heated by the resistance heaters 52 is heated to be partially decomposed. The partially decomposed PET vapor rises in the processing vessel 12 while being mixed with $O_2$ gas, and contacts with a surface of each wafer W so that a tantalum oxide film is formed thereon.

The wafers W on which the high dielectric films are formed are subjected to the modifying process, and then are unloaded from the film forming apparatus. An upper electrode film 8 is then formed on an upper surface of the high dielectric film by a sputtering apparatus at a low process temperature.

The result of the evaluation of leak current characteristics of the capacitor structure according to the present invention and a conventional capacitor structure will be described.

Figure 5:
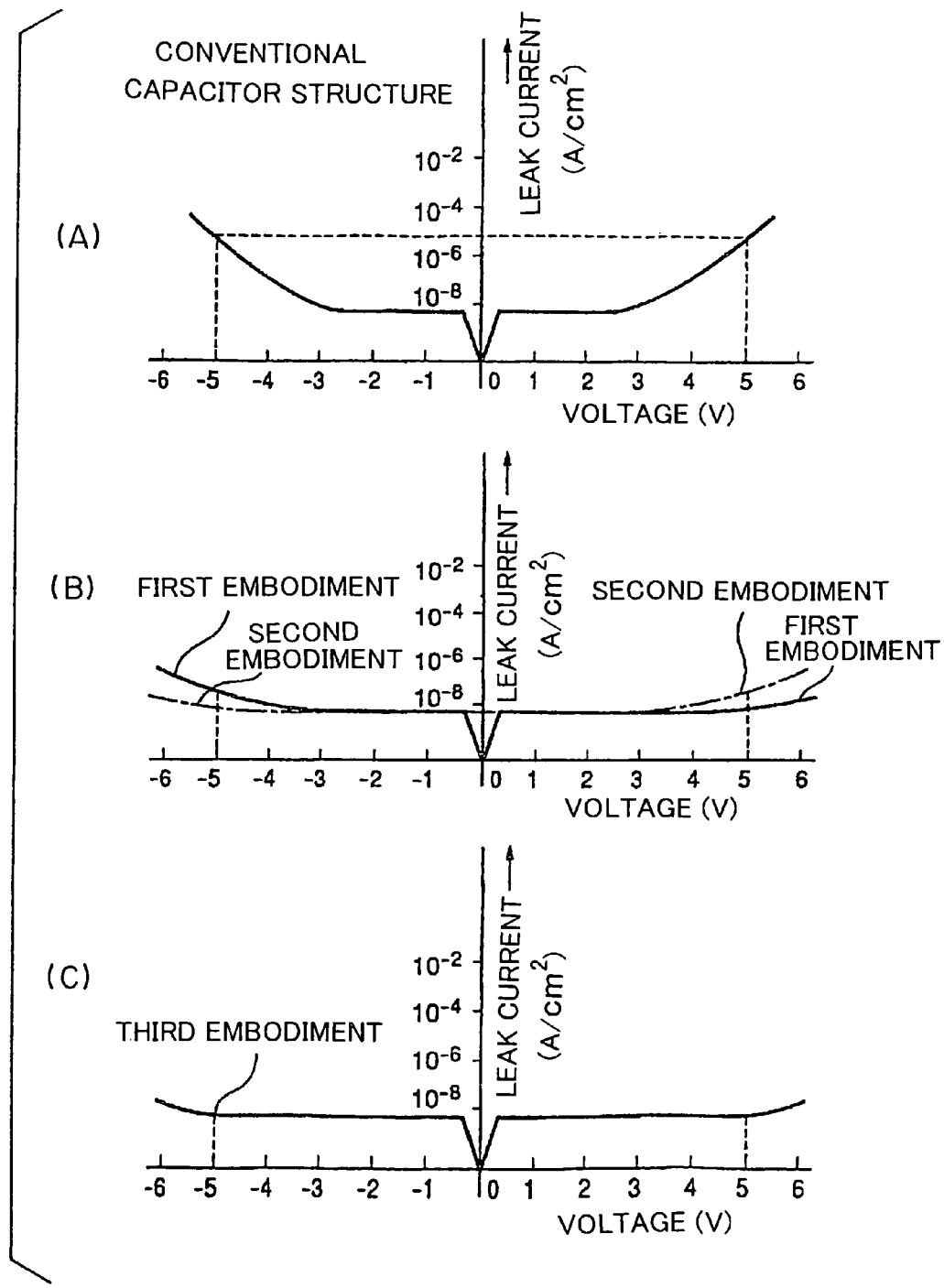
FIG. 5 is a graph showing characteristic curves indicating a relation between a voltage and a leak current in a capacitor structure according to the present invention and a conventional capacitor structure.

FIG. 5 shows graphs showing characteristic curves each indicating a relation between the applied voltage and the leak current in a capacitor structure according to the present invention and a conventional capacitor structure, when the applied voltage varies between negative value and positive value.

FIG. 5(A) shows a characteristic curve of the conventional capacitor structure (see FIG. 6), FIG. 5(B) shows characteristic curves of the first and second embodiments according to the present invention (see FIGS. 2(A) and 2(B)), and FIG. 5(C) shows a characteristic curve of the third embodiment according to the present invention (see FIG. 2(C)).

As shown in FIG. 5(A), the conventional capacitor structure showed disadvantageous characteristics, that is, the leak current was increased with the increase of an absolute value of the applied voltage like a quadratic function, when the applied voltage surpassed the range of ±3V. When the applied voltage was ±5V, the leak current was about $10^{-5} A/cm^2$.

On the contrary, with a first embodiment (a silicon-containing high dielectric film is directly in contact with the lower electrode film 4) and a second embodiment (a silicon-containing high dielectric film is directly in contact with the upper electrode film 8), as shown in FIG. 5(B), they exhibited very favorable characteristics, that is, only a slight increase in leak current upon increase in the absolute value of the applied voltage in both positive and negative sides. When the applied voltage was ±5V, the leak current was about $10^{-7}$ to $10^{-8} A/cm^2$.

As apparent from FIG. 5(B), in the event that the applied voltage was positive, the first embodiment exhibited more favorable characteristics than the second embodiment, and the leak current of the former is considerably lower than that of the latter. On the contrary, in the event that the applied voltage was negative, the second embodiment exhibited more favorable characteristics than the first embodiment, and the leak current of the former is considerably lower than that of the latter.

The reason is considered to be due to the difference in thermal histories of the lower electrode film 4 and the upper electrode film 8. That is, in the first embodiment shown in FIG. 2(A), the lower electrode film 4 formed by sputtering is exposed to a high temperature when the silicon-containing high dielectric film 60 and the silicon-free high dielectric film 62 are formed by a CVD treatment. Thus, the interface between the lower electrode film 4 and the silicon-containing high dielectric film 60 is thermally restored, resulting in favorable electric characteristics. On the other hand, in the second embodiment, since a CVD treatment is not carried out after formation of the upper electrode film 8, there is no opportunity to thermally restore the interface between the upper electrode film 8 and the silicon-containing high dielectric film 62, so that electric characteristics thereof remain deteriorated.

As shown in FIG. 5(C), the third embodiment of the present invention exhibited the best characteristics, that is, only a slight increase in leak current upon increase in the absolute value of the applied voltage regardless of the applied voltage being positive or negative. When the applied voltage was ±5V, the leak current was about $10^{-8} A/cm^2$.

Change in capacity of the capacitor structures was also evaluated. In this evaluation, the capacitor structures according to the present invention showed more favorable characteristics than the conventional capacitor structure, that is, change in capacity of the capacitor structures of the former was significantly smaller than that of the latter.

The present invention is not limited to the above-described embodiments, and various changes and modifications can be made thereto without departing from the scope of the invention.

The respective process conditions are merely illustrations, and thus gas flow rates, temperatures, pressures and so on are not limited to the above ones.

A plurality of silicon-free high dielectric films 6 may be formed between the upper and the lower electrode films, and a silicon-containing high dielectric film may be interposed between the plurality of silicon-free high dielectric films 6.

The silicon-containing high dielectric film is not limited to HfSiOx. ZrSiOx, TaSiOx or the like may be used as the silicon-containing high dielectric film.

The silicon-free high dielectric film is not limited to $Ta_2O_5$. Other sorts of tantalum oxide (TaOx), SBT (oxide of Sr, Bi, and Ta), BSTO (oxide of Ba, St, and Ti) or PZT (oxide of Pb, Zr, and Ti) may be used as the silicon-free high dielectric film.

The illustrated film forming apparatus is provided in the processing vessel 12 with the preheating means 52 for heating source gases. However, not limited thereto, the preheating means may be arranged in the pipeline(s) or the like through which the source gas(es) is flown.

The processing vessel 12 is not limited to that of the dual tube type, and may be of a so-called single tube type.

A silane series gas used for forming a silicon-containing high dielectric film is not limited to monosilane ($SiH_4$), and may be disilane ($Si_2H_6$), dichrsilane ($Si_2H_2Cl_2$), TEOS or the like.

The capacitor structure according to the present invention may be applied to both the back end side capacitor structure and the front end side capacitor structure of multi-layered devices.

The film forming apparatus used for film forming is not limited to that of a batch type that processes a plurality of wafers at one time, and may be of a single wafer processing type that processes wafers one by one.

The objects to be processed are not limited to semiconductor wafers, and may be LCD substrates and glass substrates.

What is claimed is:

1. A film forming method for depositing a plurality of high-k dielectric films of metal oxide films on a surface of a process object, comprising the steps of:

supplying a silane series gas into a processing vessel for a time period, and thereafter supplying a metal-containing gas into the processing vessel while continuing to supply the silane series gas into the processing vessel, thereby forming a silicon-containing high-k dielectric film of a metal oxide containing silicon atoms by chemical vapor deposition; and p1 forming a silicon-free high-k dielectric film of a metal oxide which contains no silicon atoms.

2. The film forming method according to claim 1, wherein:

the step of forming a silicon-containing high-k dielectric film includes a step of forming a first silicon-containing high-k dielectric film and a step of forming a second silicon-containing high-k dielectric film; and the step of forming the first silicon-containing high-k dielectric film is carried out right before the step of forming a silicon-free high-k dielectric film, and the step of forming the second silicon-containing high-k dielectric film is carried out right after the step of forming a silicon-free high-k dielectric film.

3. The film forming method according to claim 1, wherein the silicon-containing high-k dielectric film is made of a material selected from the group consisting of $HfSiOx$, $ZrSiOx$ and $TaSiOx$ (x is a positive number).

4. The film forming method according to claim 1, wherein the silicon-free high-k dielectric film is made of a material selected from the group consisting of $TaOx$, $HfOx$, $ZrOx$ (x is a positive number), SBT (oxide of Sr, Bi and Ta), BSTO (oxide of Ba, St and Ti), and PZT (oxide of Pb, Zr and Ti).

* * * * *